US012666906B2

(12) United States Patent
Shibata et al.

(10) Patent No.: US 12,666,906 B2
(45) Date of Patent: Jun. 23, 2026

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Jin Shibata, Toyama (JP); Satoru Takahata, Toyama (JP); Ichiro Nunomura, Toyama (JP); Gen Shikida, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 705 days.

(21) Appl. No.: 18/078,478

(22) Filed: Dec. 9, 2022

(65) Prior Publication Data

US 2023/0187243 A1     Jun. 15, 2023

(30) Foreign Application Priority Data

Dec. 13, 2021    (JP) ................................. 2021-201734

(51) Int. Cl.
H10P 72/00          (2026.01)
C23C 16/24          (2006.01)
(Continued)

(52) U.S. Cl.
CPC .......... H10P 72/0616 (2026.01); C23C 16/24 (2013.01); C23C 16/52 (2013.01);
(Continued)

(58) Field of Classification Search
CPC ......... H01L 21/67288; H01L 21/02532; H01L 21/02595; H01L 21/0262; H01L 21/67253;
(Continued)

(56) References Cited

U.S. PATENT DOCUMENTS

| | | | | |
|---|---|---|---|---|
| 9,559,022 B1 * | 1/2017 | Takeda | .............. | H01L 21/02211 |
| 2007/0048956 A1 * | 3/2007 | Dip | ................... | H01L 21/02532 |
| | | | | 438/312 |

(Continued)

FOREIGN PATENT DOCUMENTS

| | | | | |
|---|---|---|---|---|
| JP | 2007-019068 A | 1/2007 | | |
| JP | 2009135433 A | * 6/2009 | ....... | H01L 21/68764 |

(Continued)

OTHER PUBLICATIONS

Japanese Office Action issued on May 23, 2023 for Japanese Patent Application No. 2021-201734.

(Continued)

*Primary Examiner* — Mohammed Shamsuzzaman
(74) *Attorney, Agent, or Firm* — Volpe Koenig

(57)     ABSTRACT

A technique that includes: a substrate holder provided with a substrate mounting table on which a substrate is mounted; a substrate transferrer configured to load or unload the substrate onto or from the substrate mounting table; a process container configured to accommodate the substrate holder holding the substrate; a film-forming gas supply system configured to supply a film-forming gas to the substrate in the process container; and a controller configured to be capable of controlling the substrate transferrer and the film-forming gas supply system to interrupt execution of a film forming process for supplying the film-forming gas to the substrate and perform a process for separating the substrate mounted on the substrate mounting table at least once until a film having a desired thickness is formed on the substrate after the film forming process is started.

14 Claims, 8 Drawing Sheets

1

(51) Int. Cl.

| | | |
|---|---|---|
| *C23C 16/52* | (2006.01) | |
| *H10P 14/20* | (2026.01) | |
| *H10P 14/24* | (2026.01) | |
| *H10P 72/10* | (2026.01) | |
| *H10P 72/30* | (2026.01) | |
| *H10P 74/20* | (2026.01) | |

(52) U.S. Cl.
CPC .......... *H10P 14/24* (2026.01); *H10P 14/3411* (2026.01); *H10P 14/3456* (2026.01); *H10P 72/0604* (2026.01); *H10P 72/19* (2026.01); *H10P 72/3308* (2026.01); *H10P 72/3411* (2026.01); *H10P 74/203* (2026.01)

(58) Field of Classification Search
CPC ........... H01L 21/6735; H01L 21/67751; H01L 21/67778; H01L 22/12; H01L 21/6723; H01L 21/67303; H01L 21/68742; H01L 21/67017; H01L 21/67757; H01L 21/67781; C23C 16/24; C23C 16/52; C23C 16/44; C23C 16/45523; C23C 16/45544; C23C 16/458
See application file for complete search history.

(56) References Cited

U.S. PATENT DOCUMENTS

| | | | | |
|---|---|---|---|---|
| 2007/0218702 | A1* | 9/2007 | Shimizu | C23C 16/36 438/758 |
| 2010/0055319 | A1* | 3/2010 | Kato | H01L 21/68764 118/725 |
| 2010/0055351 | A1* | 3/2010 | Kato | C23C 16/45521 118/712 |
| 2010/0227059 | A1* | 9/2010 | Kato | C23C 16/45551 427/255.28 |
| 2012/0003825 | A1* | 1/2012 | Dip | H01L 21/02381 438/493 |
| 2015/0279751 | A1 | 10/2015 | Otaki et al. | |
| 2017/0067157 | A1* | 3/2017 | Ashihara | C23C 14/50 |
| 2019/0189440 | A1* | 6/2019 | Orihashi | C23C 16/401 |
| 2020/0035493 | A1* | 1/2020 | Clark | H01L 21/28202 |
| 2023/0343614 | A1* | 10/2023 | Morita | H01L 21/67098 |

FOREIGN PATENT DOCUMENTS

| | | | | | |
|---|---|---|---|---|---|
| JP | 2010206025 | A | * | 9/2010 | ....... C23C 16/45551 |
| JP | 2014-225514 | A | | 12/2014 | |
| JP | 2015-035583 | A | | 2/2015 | |
| JP | 2015-192094 | A | | 11/2015 | |
| JP | 2016-122750 | A | | 7/2016 | |
| JP | 2017-069519 | A | | 4/2017 | |
| KR | 20050060161 | A | * | 6/2005 | ............. C23C 16/44 |

OTHER PUBLICATIONS

Taiwan Office Action issued on Jul. 10, 2023 for Taiwan Patent Application No. 111139758.

* cited by examiner

*FIG. 7A*
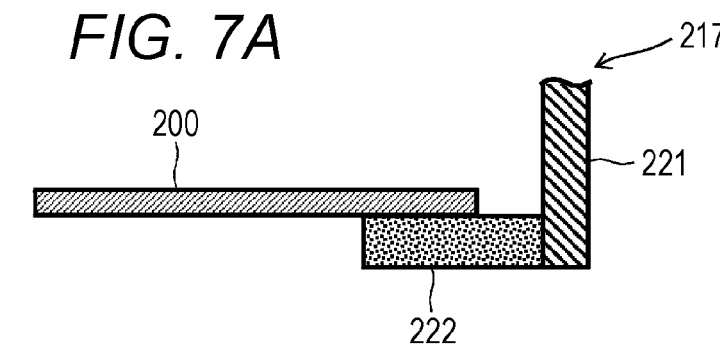
*FIG. 7B*
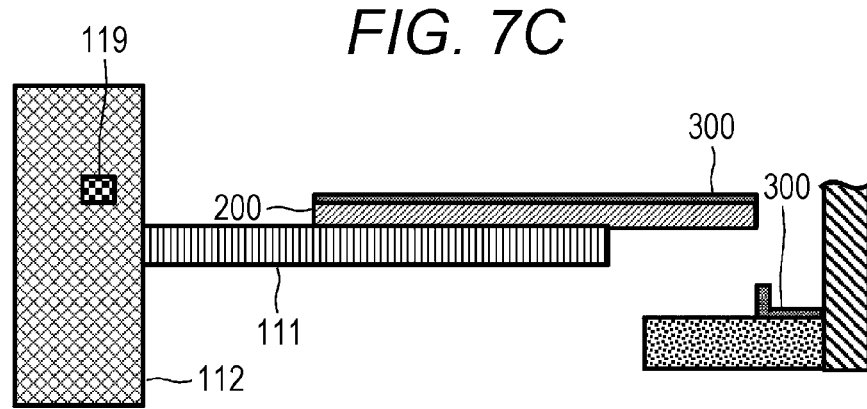
*FIG. 7C*
*FIG. 7D*
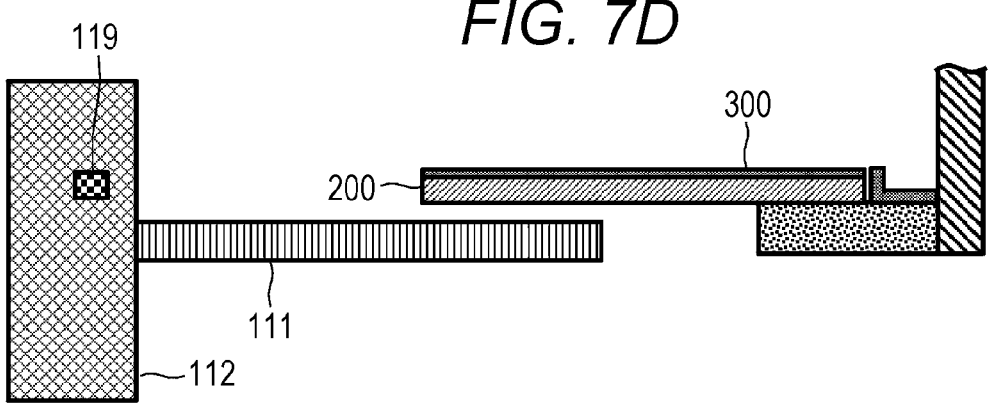

SUBSTRATE PROCESSING APPARATUS, METHOD OF MANUFACTURING SEMICONDUCTOR DEVICE, AND RECORDING MEDIUM

CROSS REFERENCE TO RELATED APPLICATIONS

This application claims foreign priority under 35 U.S.C. § 119(a)-(d) to Application No. JP2021-201734 filed on Dec. 13, 2021, the entire contents of which are hereby incorporated by reference.

FIELD

The present disclosure relates to a substrate processing apparatus, a method of manufacturing a semiconductor device, and a recording medium.

DESCRIPTION OF THE RELATED ART

As one step in the process of manufacturing a semiconductor device, a film having a desired thickness is formed on a substrate held by a substrate holder, and then the substrate is unloaded from the substrate holder.

SUMMARY

The present disclosure is to provide a technique for avoiding a situation in which, when unloading a substrate from a substrate holder, the substrate and the substrate holder are fixed to each other by a formed film and accordingly, the substrate cannot be separated from the substrate holder.

According to an embodiment of the present disclosure, there is provided a technique that includes:

a substrate holder provided with a substrate mounting table on which a substrate is mounted;

a substrate transferrer configured to load or unload the substrate onto or from the substrate mounting table;

a process container configured to accommodate the substrate holder holding the substrate;

a film-forming gas supply system configured to supply a film-forming gas to the substrate in the process container; and a controller configured to control the substrate transferrer and the film-forming gas supply system to interrupt execution of a film forming process for supplying the film-forming gas to the substrate and perform a process for separating the substrate mounted on the substrate mounting table at least once until a film having a desired thickness is formed on the substrate after the film forming process is started.

BRIEF DESCRIPTION OF THE DRAWINGS

FIG. 7A is a partially enlarged vertical cross-sectional view of the boat after a wafer is mounted on a substrate mounting table. FIG. 7B is a partially enlarged vertical cross-sectional view of the boat before a film having a critical thickness is formed on the wafer on the substrate mounting table. FIG. 7C is a diagram showing a state in which the wafer on the substrate mounting table is lifted by a tweezer. FIG. 7D is a diagram showing a state in which the lifted wafer is mounted at its original position on the substrate mounting table by the tweezer.

DETAILED DESCRIPTION

An Embodiment of the Present Disclosure

Hereinafter, an embodiment of the present disclosure will be described. All of the diagrams used in the following description are schematic, and dimensional relationships between elements, ratios between the elements, and the like illustrated in the diagrams do not necessarily match actual ones. The dimensional relationships between elements, the ratios between the elements, and the like do not necessarily match between a plurality of diagrams.

(1) Overall Configuration Example of Substrate Processing Apparatus

Figure 1:
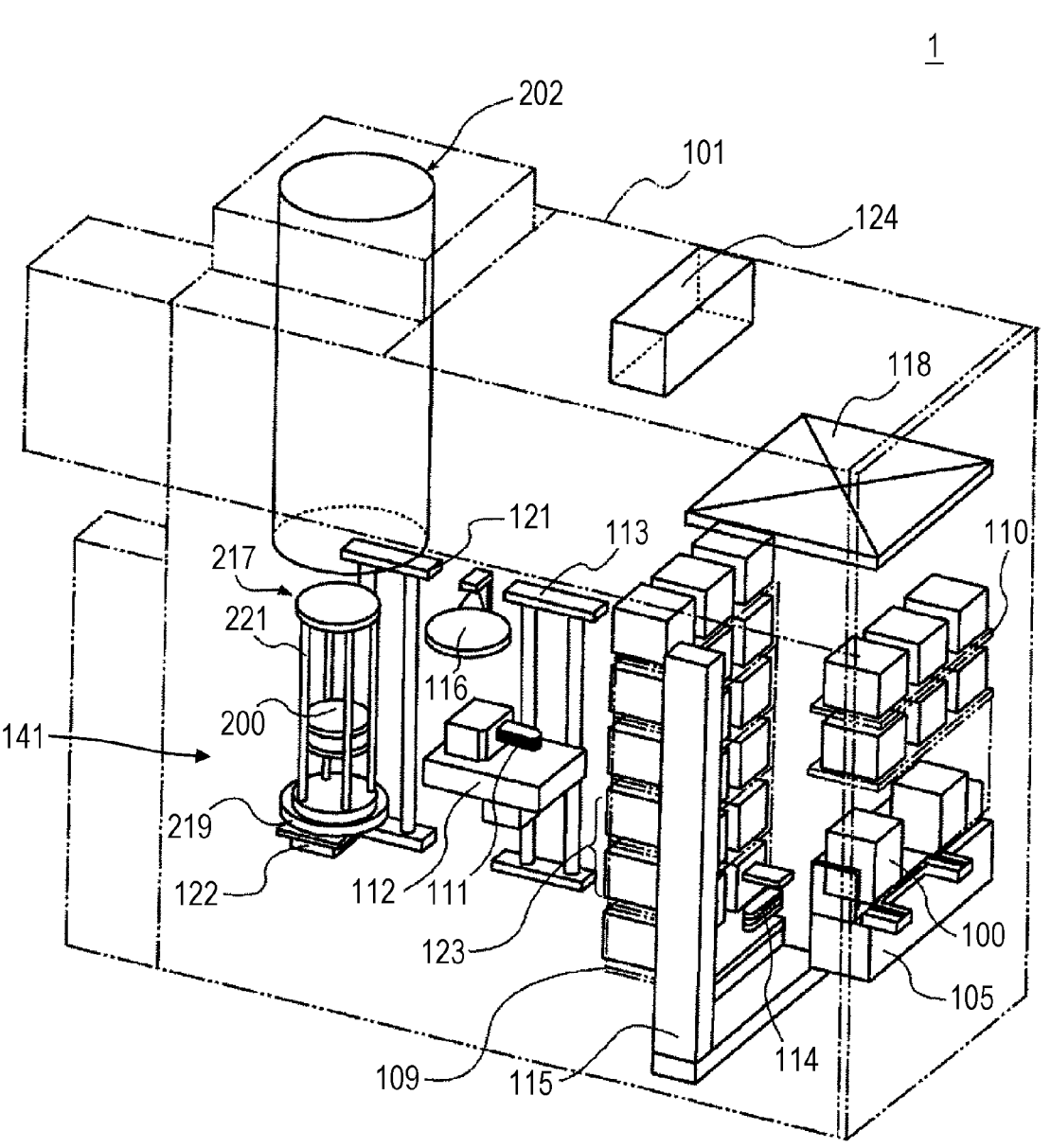
FIG. 1 is a see-through perspective view of a substrate processing apparatus preferably used in an embodiment of the present disclosure.

As shown in FIG. 1, a substrate processing apparatus 1 is configured as a batch type vertical heat treatment apparatus. The substrate processing apparatus 1 includes a housing 101 that is a pressure-resistant container. For example, a process furnace 202 is provided inside the housing 101, and a controller 124 is provided outside the housing 101. When transferring a wafer 200 serving as a substrate into and out of the housing 101, a cassette 100 serving as a substrate transfer container is used. The cassette 100 is configured to be able to accommodate a plurality of (for example, 25) wafers 200. A cassette transfer port (not shown) for transferring the cassette 100 into and out of the housing 101 is provided in the housing 101.

A cassette stage 105 (hereinafter, referred to as a stage 105) serving as a cassette transfer table is provided in the housing 101. The cassette 100 is loaded onto the stage 105 and unloaded from the stage 105 by an external transfer device (not shown).

A cassette shelf 109 for accommodating the cassette 100 is provided near the stage 105. The cassette shelf 109 is configured to store at least one or more cassettes 100 in a plurality of rows and a plurality of columns. As a part of the cassette shelf 109, a transfer shelf 123 for accommodating the cassette 100 to be transferred by a substrate transferrer 112, which will be described later, is provided.

A spare cassette shelf 110 for storing a spare cassette 100 is provided above the stage 105. Between the stage 105 and the cassette shelf 109, a cassette elevator 115 (hereinafter, referred to as an "elevator 115") capable of moving up and down while holding the cassette 100 and a cassette transferrer 114 (hereinafter, referred to as a "transferrer 114") for transferring the cassette 100 are provided. The cassette 100 is transferred among the stage 105, the cassette shelf 109, and the spare cassette shelf 110 by the interlocking operation of the elevator 115 and the transferrer 114.

The process furnace 202 is provided in the upper part of the inside of the housing 101. A lower end of the process furnace 202 is configured to be opened and closed by a furnace opening shutter 116. Below the process furnace 202, a boat elevator 121 (hereinafter, referred to as an elevator 121) for moving a boat 217 serving as a substrate holder up and down with respect to the process furnace 202 is provided. A seal cap 219 serving as a lid is horizontally mounted on an elevating member 122 serving as a connector connected to the elevating platform of the elevator 121. The seal cap 219 is configured to be able to vertically support the boat 217 and close the lower end of the process furnace 202. Below the process furnace 202, a waiting room 141 where loading and unloading of the wafer 200, separation process of the wafer 200 to be described later, and the like are performed is provided.

Figure 5:
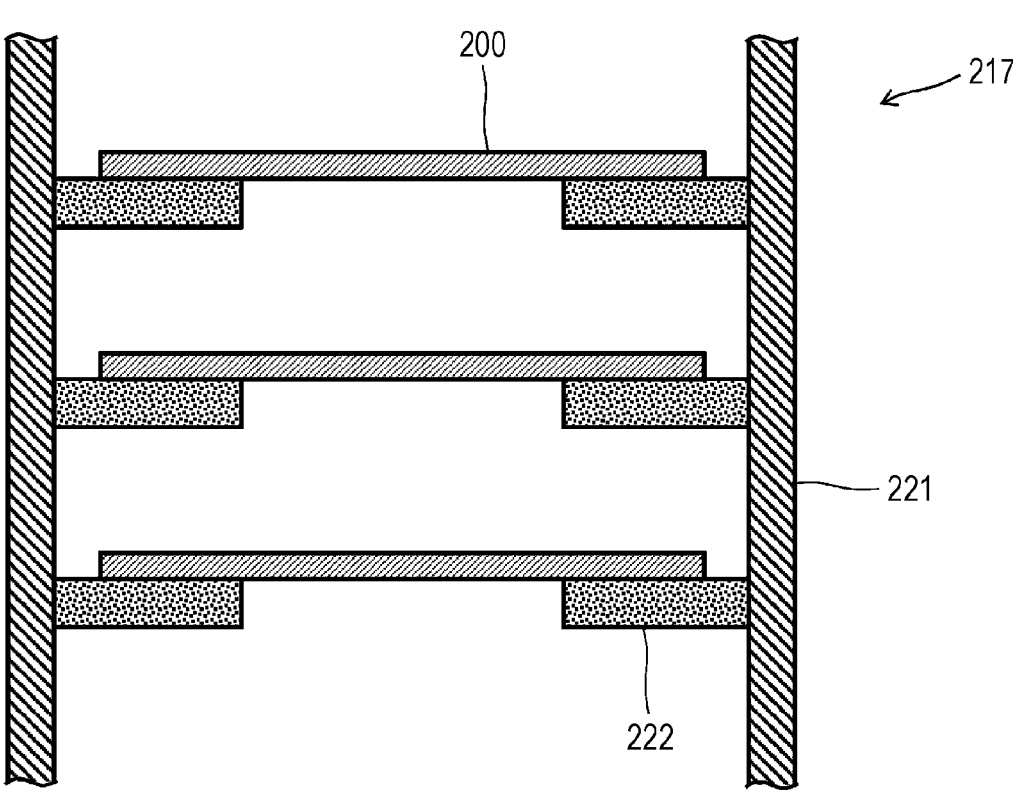
FIG. 5 is a partially enlarged vertical cross-sectional view of a boat provided in the substrate processing apparatus preferably used in the embodiment of the present disclosure.
Figure 6:
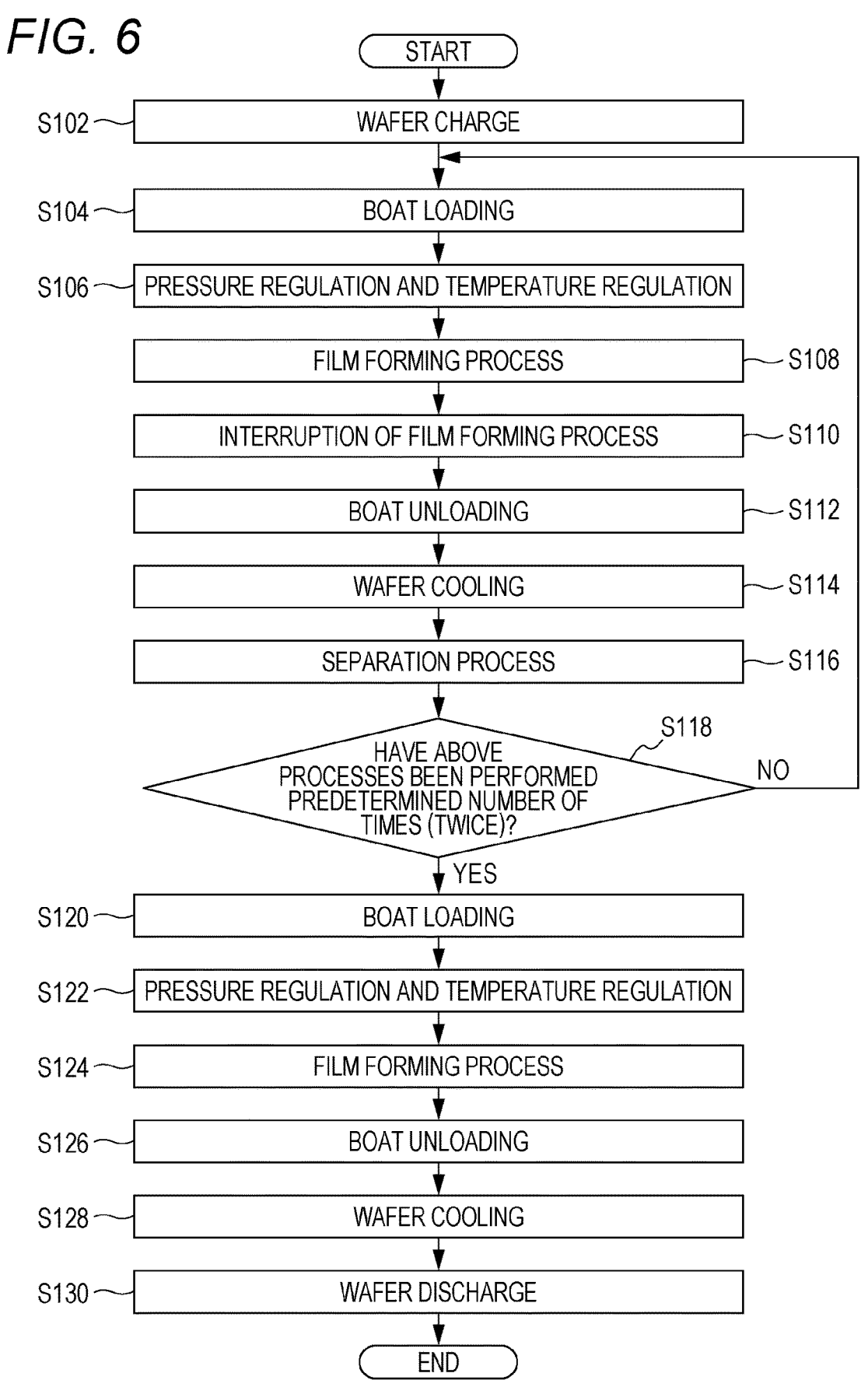
FIG. 6 is a flowchart showing an example of the procedure of a substrate processing process according to the embodiment of the present disclosure.

The boat 217 includes a plurality of boat columns 221. A plurality of substrate mounting tables 222 for mounting the wafer 200 are provided in the boat column 221 (see FIG. 5), and the boat 217 is configured to support a plurality of (for example, 200 to 250) wafers 200 in multiple stages.

As shown in FIG. 1, the substrate transferrer 112 is provided between the elevator 121 and the cassette shelf 109. The substrate transferrer 112 includes a predetermined number (for example, five) of tweezers 111 that hold the wafer 200 in a horizontal posture, and is attached to a substrate transferrer elevator 113 (hereinafter, referred to as an elevator 113) for moving the substrate transferrer 112 up and down. By the interlocking operation of the elevator 113, the substrate transferrer 112, and the tweezers 111, the wafer 200 is loaded onto the substrate mounting table 222 of the boat 217 and unloaded from the substrate mounting table 222. The substrate transferrer 112 includes a sensor 119 for detecting the success or failure of the separation process, which will be described later (see FIGS. 7C and 7D).

A cleaner 118 for supplying clean air, which is a purified atmosphere, is provided above the cassette shelf 109. The cleaner 118 includes a supply fan and a dust filter (both not shown), and is configured to circulate clean air inside the housing 101.

(2) Operation Example of the Substrate Processing Apparatus 1

The cassette 100 loaded with the wafers 200 in a vertical posture is mounted on the stage 105 by an external transfer device so that the wafer loading/unloading port of the cassette 100 faces upward. Thereafter, the cassette 100 is rotated by 90° by the stage 105 so that the wafers 200 are in a horizontal posture.

The cassette 100 is then temporarily stored by being transferred from the stage 105 to the designated shelf position of the cassette shelf 109 or the spare cassette shelf 110 by the interlocking operation of the elevator 115 and the transferrer 114, and is then transferred to the transfer shelf

123. Alternatively, the cassette 100 is directly transferred from the stage 105 to the transfer shelf 123 by the interlocking operation of the elevator 115 and transferrer 114.

When the cassette 100 is transferred to the transfer shelf 123, the wafer 200 is picked up from the cassette 100 by the tweezer 111 provided in the substrate transferrer 112 and loaded onto the substrate mounting table 222 provided in the boat 217. After transferring the wafer 200 to the boat 217, the substrate transferrer 112 returns to the cassette 100 and loads the next wafer 200 onto the substrate mounting table 222 of the boat 217.

When a predetermined number (for example, 100 to 200) of wafers 200 are loaded onto the substrate mounting table 222 of the boat 217, the furnace opening shutter 116 closing the lower end of the process furnace 202 is opened to open the lower end of the process furnace 202. The boat 217 holding the group of wafers 200 is then loaded into the process furnace 202 by the lifting operation of the elevator 121, and the lower portion of the process furnace 202 is closed with the seal cap 219.

After loading, the wafer 200 is subjected to predetermined processing. After processing, the wafer 200 and the cassette 100 are ejected to the outside of the housing 101 in the reverse order described above.

(3) Configuration Example of the Process Furnace 202

Figure 2:
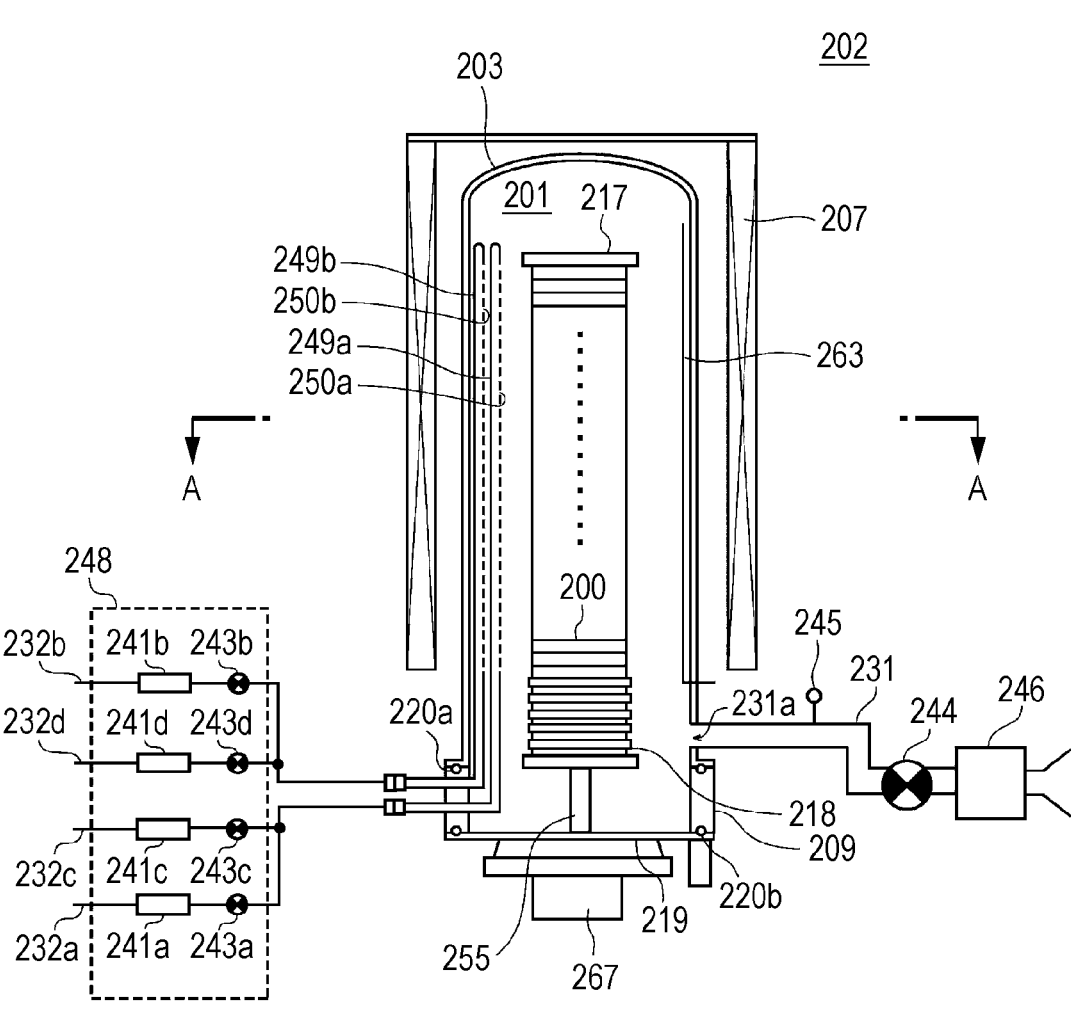
FIG. 2 is a schematic configuration diagram of a vertical process furnace of the substrate processing apparatus preferably used in the embodiment of the present disclosure, and is a longitudinal cross-sectional view of a process furnace.
Figure 2:
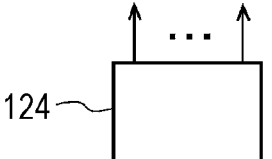

As shown in FIG. 2, the process furnace 202 has a heater 207 serving as a temperature regulator (heater). The heater 207 has a cylindrical shape, and is vertically mounted by being supported by a holding plate. The heater 207 also functions as an activator (exciter) that thermally activates (excites) the gas.

Inside the heater 207, a reaction tube 203 is provided concentrically with the heater 207. The reaction tube 203 is formed of a heat-resistant material such as quartz ($SiO_2$) or silicon carbide (SiC), and is formed in a cylindrical shape with a closed upper end and an open lower end. Below the reaction tube 203, a manifold 209 is provided concentrically with the reaction tube 203. The manifold 209 is formed of a metal material such as stainless steel (SUS), and is formed in a cylindrical shape with open upper and lower ends. The upper end of the manifold 209 engages the lower end of the reaction tube 203, and is configured to support the reaction tube 203. An O-ring 220a serving as a seal member is provided between the manifold 209 and the reaction tube 203. The reaction tube 203 is vertically mounted in the same manner as the heater 207. A process container (reaction container) is mainly configured by the reaction tube 203 and the manifold 209. A process chamber 201 is formed in a cylindrical hollow portion of the process container. The process chamber 201 is configured to be able to accommodate the wafer 200 serving as a substrate. The wafer 200 is processed in the process chamber 201.

In the process chamber 201, nozzles 249a and 249b serving as first and second suppliers are provided to pass through the side wall of the manifold 209. The nozzles 249a and 249b are also referred to as a first nozzle and a second nozzle, respectively. The nozzles 249a and 249b are formed of a heat-resistant material such as quartz or SiC. Gas supply pipes 232a and 232b are connected to the nozzles 249a and 249b, respectively. The nozzles 249a and 249b are provided adjacent to each other.

In the gas supply pipes 232a and 232b, mass flow controllers (MFCs) 241a and 241b that are flow rate controllers and valves 243a and 243b that are opening/closing valves are provided in this order from the upstream side of the gas flow. A gas supply pipe 232c is connected to the downstream side of the valve 243a of the gas supply pipe 232a. In the gas supply pipe 232c, an MFC 241c and a valve 243c are provided in this order from the upstream side of the gas flow. A gas supply pipe 232d is connected to the downstream side of the valve 243b of the gas supply pipe 232b. In the gas supply pipe 232d, an MFC 241d and a valve 243d are provided in this order from the upstream side of the gas flow. The gas supply pipes 232a to 232d are formed of a metal material such as SUS.

Figure 3:
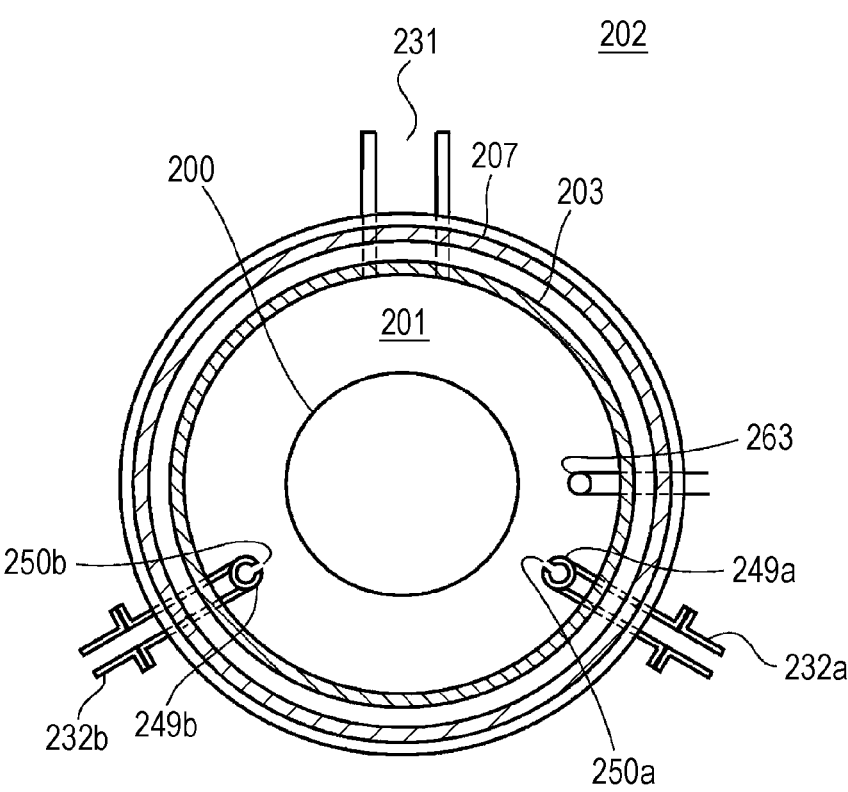
FIG. 3 is a schematic configuration diagram of the vertical process furnace of the substrate processing apparatus preferably used in the embodiment of the present disclosure, and is a cross-sectional view of the process furnace taken along the line AA in FIG. 2.

As shown in FIG. 3, the nozzles 249a and 249b are provided in an annular space, in plan view, between the inner wall of the reaction tube 203 and the wafer 200 along the upper part from the lower part of the inner wall of the reaction tube 203 so as to rise upward in the arrangement direction of the wafers 200. That is, the nozzles 249a and 249b are provided along a wafer arrangement region where the wafers 200 are arranged in a region horizontally surrounding the wafer arrangement region on the lateral side of the wafer arrangement region. Gas supply holes 250a and 250b for supplying gas are provided on the side surfaces of the nozzles 249a and 249b, respectively. Each of the gas supply holes 250a and 250b is open toward the center of the wafer 200, in plan view, so that it is possible to supply gas toward the wafer 200. A plurality of gas supply holes 250a and 250b are provided from the bottom to the top of the reaction tube 203.

A raw material gas, which is one of the film-forming gases, is supplied from the gas supply pipe 232a into the process chamber 201 through the MFC 241a, the valve 243a, and the nozzle 249a.

A dopant gas, which is one of the film-forming gases, is supplied from the gas supply pipe 232b into the process chamber 201 through the MFC 241b, the valve 243b, and the nozzle 249b.

An inert gas is supplied from the gas supply pipes 232c and 232d into the process chamber 201 through the MFCs 241c and 241d, the valves 243c and 243d, the gas supply pipes 232a and 232b, and the nozzles 249a and 249b. The inert gas acts as purge gas, carrier gas, diluent gas, and the like.

A film-forming gas supply system (raw material gas supply system, dopant gas supply system) is mainly formed by the gas supply pipes 232a and 232b, the MFCs 241a and 241b, and the valves 243a and 243b. An inert gas supply system is mainly formed by the gas supply pipes 232c and 232d, the MFCs 241c and 241d, and the valves 243c and 243d.

The supply systems described above may be configured as an integrated supply system 248 in which the valves 243a to 243d, the MFCs 241a to 241d, and the like are integrated. The integrated supply system 248 is connected to each of the gas supply pipes 232a to 232d, and the operation of supplying various substances (various gases) into the gas supply pipes 232a to 232h, that is, the opening and closing operations of the valves 243a to 243d, the flow rate regulating operations of the MFCs 241a to 241d, and the like are controlled by the controller 124, which will be described later. The integrated supply system 248 is configured as an integrated or divided integrated unit, and can be attached and detached to and from the gas supply pipes 232a to 232d or the like in units of integrated units. Therefore, maintenance, replacement, expansion, and the like of the integrated supply system 248 can be performed in units of integrated units.

Below the side wall of the reaction tube 203, an exhaust port 231a for exhausting the atmosphere inside the process chamber 201 is provided. The exhaust port 231a may be provided along the upper part from the lower part of the inner wall of the reaction tube 203, that is, along the wafer arrangement region. An exhaust pipe 231 is connected to the exhaust port 231a. The exhaust pipe 231 is formed of a metal material such as SUS. A vacuum pump 246 serving as a vacuum exhaust is connected to the exhaust pipe 231 through a pressure sensor 245 serving as a pressure detector for detecting the pressure in the process chamber 201 and an auto pressure controller (APC) valve 244 serving as a pressure regulator. The APC valve 244 can perform vacuum exhaust and vacuum exhaust stop in the process chamber 201 by opening and closing the valve in a state in which the vacuum pump 246 is operated, and can regulate the pressure in the process chamber 201 by adjusting the degree of valve opening based on pressure information detected by the pressure sensor 245 in a state in which the vacuum pump 246 is operated. An exhaust system is mainly formed by the exhaust pipe 231, the APC valve 244, and the pressure sensor 245. The vacuum pump 246 may be included in the exhaust system.

Below the manifold 209, the seal cap 219 serving as a furnace opening lid capable of hermetically closing the lower end opening of the manifold 209 is provided. The seal cap 219 is formed of a metal material such as SUS, and is formed in a disc shape. An O-ring 220b serving as a seal member in contact with the lower end of the manifold 209 is provided on the upper surface of the seal cap 219. A rotator 267 for rotating the boat 217 is provided below the seal cap 219. A rotating shaft 255 of the rotator 267 is formed of a metal material such as SUS, and passes through the seal cap 219 and is connected to the boat 217. The rotator 267 is configured to rotate the wafer 200 by rotating the boat 217. The seal cap 219 is configured to be vertically moved up and down by the elevator 121 provided outside the reaction tube 203.

The boat 217 serving as a substrate holder includes a plurality of substrate mounting tables 222 for supporting the wafer 200, and is configured to support, for example, 25 to 200 wafers 200 in multiple stages while the wafers 200 are arranged in the vertical direction in a horizontal posture and in a state in which the centers of the wafers 200 are aligned with each other, that is, such that the wafers 200 are arranged at intervals. The boat 217 is formed of a heat-resistant material such as quartz or SiC. At the lower part of the boat 217, a heat insulating plate 218 formed of a heat-resistant material such as quartz or SiC is supported in multiple stages.

A temperature sensor 263 serving as a temperature detector is provided in the reaction tube 203. By adjusting the supply of power to the heater 207 based on the temperature information detected by the temperature sensor 263, the temperature inside the process chamber 201 has a desired temperature distribution. The temperature sensor 263 is provided along the inner wall of the reaction tube 203.

Figure 4:
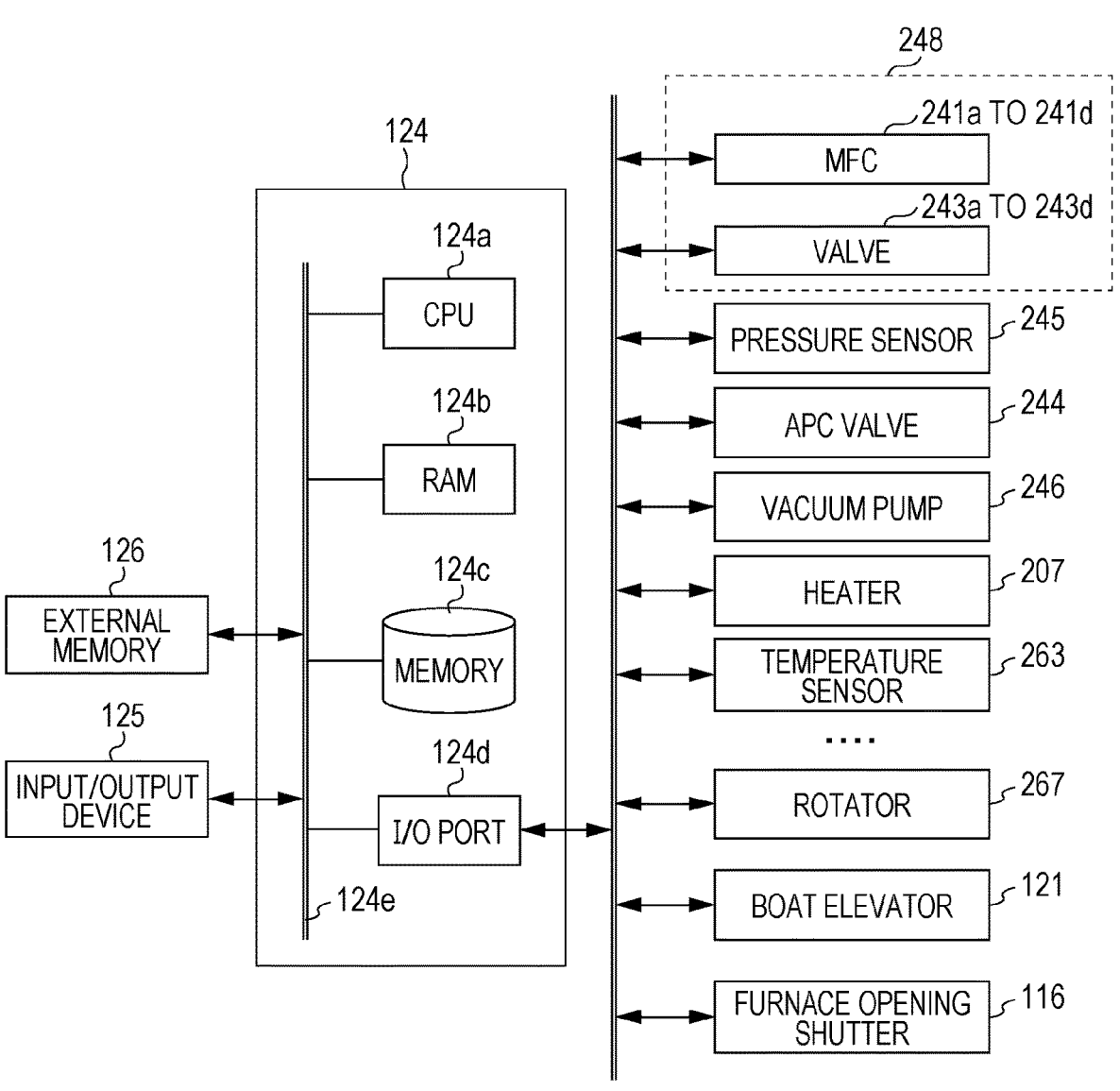
FIG. 4 is a schematic configuration diagram of a controller provided in the substrate processing apparatus preferably used in the embodiment of the present disclosure, and is a block diagram showing the control system of the controller.

As shown in FIG. 4, the controller 124 is configured as a computer including a central processing unit (CPU) 124a, a random access memory (RAM) 124b, a memory 124c, and an I/O port 124d. The RAM 124b, the memory 124c, and the I/O port 124d are configured to be able to transmit and receive data to and from the CPU 124a through an internal bus 124e. An input/output device 125 configured as, for example, a touch panel or the like is connected to the controller 124. An external memory 126 can be connected to the controller 124.

The memory 124c is configured of, for example, a flash memory, a hard disk drive (HDD), a solid state drive (SSD), and the like. In the memory 124c, a control program for controlling the operation of the substrate processing apparatus 1, a process recipe describing procedures and conditions for substrate processing, which will be described later, and the like are stored in a readable manner. The process recipe is a combination that allows the controller 124 to cause the substrate processing apparatus 1 to execute each procedure in substrate processing, which will be described later, and to obtain a predetermined result, and functions as a program. Hereinafter, the process recipe, the control program, and the like are also collectively and simply referred to as a program. The process recipe is also simply referred to as a recipe. Cases where the term "program" is used in this specification include a case where only a recipe is included, a case where only a control program is included, and a case where both the recipe and the control program are included. The RAM 124b is configured as a memory area (work area) in which programs, data, and the like read by the CPU 124a are temporarily stored.

The I/O port 124d is connected to the MFCs 241a to 241d, the valves 243a to 243d, the pressure sensor 245, the APC valve 244, the vacuum pump 246, the temperature sensor 263, the heater 207, the rotator 267, the elevator 121, the furnace opening shutter 116, and the like.

The CPU 124a can read a control program from the memory 124c and execute the control program, and can read a recipe from the memory 124c according to the input of an operation command from the input/output device 125 or the like. According to the content of the read recipe, the CPU 124a can control the operations of regulating the flow rates of various substances (various gases) by the MFCs 241a to 241d, the opening and closing operations of the valves 243a to 243d, the opening and closing operation of the APC valve 244 and the pressure regulating operation of the APC valve 244 based on the pressure sensor 245, starting and stopping of the vacuum pump 246, the operation of regulating the temperature of the heater 207 based on the temperature sensor 263, the operation of adjusting the rotation and rotation speed of the boat 217 by the rotator 267, the up-and-down operation of the boat 217 by the elevator 121, and the like.

The controller 124 can be configured by installing the above-described program stored in the external memory 126 into the computer. Examples of the external memory 126 include a magnetic disk such as an HDD, an optical disk such as a CD, a magneto-optical disk such as an MO, and a semiconductor memory such as a USB memory or an SSD. The memory 124c or the external memory 126 is configured as a non-transitory computer-readable recording medium. Hereinafter, these are also collectively and simply referred to as a recording medium. Cases where the term "recording medium" is used in this specification include a case where only the memory 124c is included, a case where only the external memory 126 is included, and a case where both the memory 124c and the external memory 126 are included. The program may be provided to the computer by using communication means, such as the Internet or a dedicated line, without using the external memory 126.

(4) Substrate Processing Process

Next, a substrate processing process according to an embodiment of the present disclosure will be described with reference to FIGS. 6 and 7A to 7D. In the following description, the operation of each unit forming the substrate processing apparatus 1 is controlled by the controller 124.

In the present embodiment, an example will be described in which a polycrystalline silicon film (poly-Si film, polycrystalline Si film) is formed on the wafer 200 by supplying a silane-based gas to the wafer 200 as a raw material gas, which is one of the film-forming gases, and supplying a gas containing phosphorus (P), which is a kind of dopant, to the wafer 200 as a dopant gas, which is one of the film-forming gases.

In the present embodiment, a case of forming a polycrystalline silicon film having a thickness of 14 μm on the wafer 200 as a film having a desired thickness will be described as an example. Setting the "desired thickness" to 14 μm is merely an example, and a polycrystalline silicon film having a thickness other than 14 μm as a desired thickness is not excluded.

The term "wafer" used in this specification may mean the wafer itself, or may mean a laminate of a wafer and a predetermined layer or film formed on its surface. The term "wafer surface" used in this specification may mean the surface of the wafer itself or the surface of a predetermined layer or the like formed on the wafer. In this specification, the term "form a predetermined layer on a wafer" means that a predetermined layer is formed directly on the surface of the wafer itself or that a predetermined layer is formed on a layer or the like formed on the wafer. The use of the term "substrate" in this specification is synonymous with the use of the term "wafer".

(Wafer Charge: S102)

The wafer 200 is loaded from the cassette 100 on the transfer shelf 123 to the boat 217 in the waiting room 141 by the substrate transferrer 112 (wafer charge). Specifically, for example, five wafers 200 are simultaneously loaded from the cassette 100 on the transfer shelf 123 onto the substrate mounting table 222 of the boat 217 by the five tweezers 111. This process continues until the scheduled wafers 200 (for example, 100 to 200 wafers 200) are loaded to the boat 217.

(Boat Loading: S104)

The furnace opening shutter 116 is then moved to open the lower end opening of the manifold 209 (shutter open). Then, as shown in FIG. 2, the boat 217 holding the wafer 200 is lifted by the elevator 121 and loaded into the process chamber 201 (boat loading). In this state, the seal cap 219 seals the lower end of the manifold 209 through the O-ring 220b. In this manner, the wafer 200 is supplied into the process chamber 201.

(Pressure Regulation and Temperature Regulation: S106)

The inside of the process chamber 201, that is, the space where the wafer 200 is located is then vacuum-exhausted (decompression-exhausted) by the vacuum pump 246 so as to have a desired pressure (degree of vacuum). At this time, the pressure in the process chamber 201 is measured by the pressure sensor 245, and the APC valve 244 is feedback-controlled based on the measured pressure information. The wafer 200 in the process chamber 201 is heated by the heater 207 to have a desired processing temperature. At this time, the supply of power to the heater 207 is feedback-controlled based on the temperature information detected by the temperature sensor 263 so that the inside of the process chamber 201 has a desired temperature distribution. The rotation of the wafer 200 by the rotator 267 is started. The valves 243c and 243d are opened to start supplying the inert gas into the process chamber 201 through the nozzles 249a and 249b, respectively. The exhaust in the process chamber 201, the heating and rotation of the wafer 200, and the supply of the inert gas are continued at least until the film forming process (S108), which will be described later, ends.

(Film Forming Process: S108)

When the inside of the process chamber 201 reaches the desired pressure and temperature, the valve 243a is opened to allow the raw material gas to flow into the gas supply pipe 232a. At the same time, the valve 243b is opened to allow the dopant gas to flow into the gas supply pipe 232b. The flow rate of the raw material gas and the flow rate of the dopant gas are regulated by the MFCs 241a and 241b, respectively, and the raw material gas and the dopant gas are supplied into the process chamber 201 through the nozzles 249a and 249b, respectively, and exhausted through the exhaust port 231a. At this time, the film-forming gas (raw material gas, dopant gas) is simultaneously supplied to the wafer 200 from the lateral side of the wafer 200 (film-forming gas supply).

The process conditions when supplying the film-forming gas in this step are as follows:

Process temperature: 300 to 700° C.
Process pressure: 1 to 10000 Pa
Raw material gas supply flow rate: 0.001 to 10 slm
Dopant gas supply flow rate: 0.0001 to 2 slm
Raw material gas and dopant gas supply time: 1 to 1000 minutes
Inert gas supply flow rate (per gas supply pipe): 0.0001 to 10 slm.

In this specification, the expression of a numerical range such as "300 to 700° C." means that the lower limit and the upper limit are included in the range. Therefore, for example, "300 to 700° C." means "300° C. or more and 700° C. or less". The same applies to other numerical ranges. In this specification, the process temperature means the temperature of the wafer 200 or the temperature inside the process chamber 201, and the process pressure means the pressure inside the process chamber 201. When 0 slm is included in the supply flow rate, 0 slm means a case where the gas is not supplied.

By supplying, for example, a silane-based gas as a raw material gas and a gas containing P as a dopant gas to the wafer 200 under the above process conditions, silicon (Si) containing P can be deposited on the surface of the wafer 200. As a result, a polycrystalline silicon film 300 doped with P serving as a dopant (hereinafter, also referred to as a P-doped Si film or simply referred to as a Si film) can be formed on the wafer 200 (see FIGS. 7A and 7B). As shown in FIG. 7B, the Si film 300 is formed not only on the wafer 200 but also on the substrate mounting table 222, and the wafer 200 is bonded to the boat 217 by the Si film 300. Here, "bonded" refers to a state in which the wafer 200 and the boat 217 are attached to each other by the Si film 300 but the wafer 200 is separated from the boat 217 by the substrate transferrer 112, and refers to a state that has not reached the state of "fixed" described later.

As the raw material gas, for example, the above-described silane-based gas containing Si serving as a main element forming the film formed on the wafer 200 can be used. As the silane-based gas, for example, silicon hydride gases such as monosilane (SiH$_4$) gas, disilane (Si$_2$H$_6$) gas, trisilane (Si$_3$H$_8$) gas, tetrasilane (Si$_4$H$_{10}$) gas, pentasilane (Si$_5$H$_{12}$) gas, and hexasilane (Si$_6$H$_{14}$) gas can be used. One or more of these can be used as the raw material gas. The same applies to a film forming process (S124) described later.

As the dopant gas, for example, a gas containing any one of group III elements (group 13 elements) and group V elements (group 15 elements) can be used. As the dopant gas, for example, a gas containing P as a group V element such as phosphine (PH$_3$) gas and a gas containing arsenic (As) as a group V element such as arsine (AsH$_3$) gas can be used. As the dopant gas, a gas containing boron (B) as a Group III element such as diborane (B$_2$H$_6$) gas and trichloroborane (BCl$_3$) gas can be used. One or more of these can be used as the dopant gas. The same applies to a film forming process (S124) described later.

As the inert gas, for example, rare gases such as nitrogen (N$_2$) gas, argon (Ar) gas, helium (He) gas, neon (Ne) gas, and xenon (Xe) gas can be used. One or more of these can be used as the inert gas. The same applies to a film forming process (S124) described later.

(Interruption of Film Forming Process: S110)

After starting the film forming process, the film forming process is interrupted until the Si film having a thickness of 14 which is a desired thickness, is formed on the wafer 200. More specifically, in a period from the start of the film forming process to the formation of the Si film having a thickness of 14 which is a desired thickness, on the wafer 200, before a film (Si film) having a critical thickness is formed on the wafer 200, the film forming process is interrupted. The "critical thickness" is the thickness of the film beyond which the separation process by the substrate transferrer 112 is not possible. More specifically, the "critical thickness" is the thickness of the film (Si film) formed on the wafer 200, beyond which the wafer 200 and the boat 217 are fixed to each other and accordingly the wafer 200 cannot be separated from the boat 217 by the substrate transferrer 112. Here, the "separation process" is a process of lifting the wafer 200 mounted on the substrate mounting table 222 and then lowering the wafer 200 to its original position on the substrate mounting table 222 by the substrate transferrer 112. "Fixed" refers to a state in which the wafer 200 and the boat 217 are firmly attached to each other by the Si film 300 and the wafer 200 cannot be separated from the boat 217 by the substrate transferrer 112.

In the present embodiment, a case of interrupting the film forming process before the film (Si film) having a critical thickness is formed on the wafer 200, for example, when the film having a thickness of 5 μm is formed on the wafer 200 assuming that the "film having a critical thickness" is a film having a thickness of 6 μm will be described as an example.

(Boat Unloading: S112)

The seal cap 219 is then lowered by the elevator 121 to open the lower end opening of the manifold 209. Then, the boat 217 is moved from the process chamber 201 to the waiting room 141 (boat unloading). After boat unloading, the furnace opening shutter 116 is moved to seal the lower end opening of the manifold 209 with the furnace opening shutter 116 (shutter closing).

(Wafer Cooling: S114)

The unloaded wafer 200 is cooled down to a predetermined temperature in the waiting room 141 while being supported by the boat 217.

(Separation Process: S116)

The tweezer 111 of the substrate transferrer 112 is then inserted below the wafer 200 mounted on the substrate mounting table 222 of the boat 217 to lift the wafer 200. At this time, the wafer 200 and the boat 217 (substrate mounting table 222) bonded to each other by the Si film 300 are separated from each other (see FIG. 7C). In the present embodiment, when the Si film 300 having a thickness of 5 μm is formed on the wafer 200, the supply of the film-forming gas is interrupted and the separation process is performed. Therefore, as will be described later, when forming a film having a desired thickness (for example, a Si film having a thickness of 14 μm) on the wafer 200, it is possible to prevent the wafer 200 and the boat 217 from being fixed to each other even if the Si film is further formed on the wafer 200 by performing the film forming process (S108) again. The wafer 200 that has been separated from the substrate mounting table 222 is then lowered by the substrate transferrer 112 to be mounted at its original position on the substrate mounting table 222 (see FIG. 7D). In the present embodiment, since the substrate transferrer 112 includes five tweezers 111, the separation process is performed simultaneously on the five wafers 200, for example. However, for the sake of convenience, a state in which one of the tweezers 111 performs the separation process is shown in FIGS. 7C and 7D.

In this step (S116), the success or failure of the separation process is determined by the sensor 119 provided in the substrate transferrer 112. The failure of the separation process refers to including at least one of a case where at least one of the boat 217, the substrate transferrer 112, and the wafer 200 is damaged and a case where the wafer 200 cannot be separated from the boat 217 with the predetermined torque of the substrate transferrer 112, for example. When the sensor 119 detects a failure of the separation process, subsequent processes in the substrate processing process are interrupted, the tweezer 111 is withdrawn from the boat 217, and an alarm is issued.

When the sensor 119 detects a failure of the separation process, the sensor 119 may perform a retry process, which is another separation process using the tweezer 111. The retry process can be performed a predetermined number of times, one or more times. After performing the retry process, when the sensor 119 detects a success of the separation process in the retry process, the process proceeds to the next step (S118). When the sensor 119 detects a failure of the separation process in the retry process, the subsequent process may be interrupted, the tweezer 111 may be withdrawn from the boat 217, and an alarm may be issued. In this case, it is preferable not to perform the next batch process. In the retry process, it is not always necessary to operate the five tweezers 111. For example, only the number of tweezers 111 corresponding to the number of wafers 200 for which a failure in the separation process has been detected may be operated.

Here, the success of the separation process in the retry process means that the wafers 200, which are targets of the retry process, can be separated from the boat 217 without being damaged, for example. The failure of the separation process in the retry process means that at least one wafer 200, among the wafers 200 that are targets of the retry process, cannot be separated from the boat 217 or that the wafer 200 is damaged when the wafer 200 is separated, for example. When the failure of the separation process in the retry process is detected, for example, if one or more wafers 200 among the wafers 200 that are targets of the retry process can be separated from the boat 217, the wafer 200, the process proceeds to the next step (S118) for the one or more wafers 200. At this time, the wafer 200 that has failed to be separated from the boat 217 may remain fixed to the boat 217, or may be removed from the boat 217 by using a predetermined method.

(Determination Step: S118)

When the wafer separation process (S116) ends, it is determined whether or not one cycle (the above-described series of processes (S104 to S116)) has been performed a predetermined number of times (twice), that is, it is determined whether or not the thickness of the formed film has reached 10 µm in the film forming process (S108). Then, if the one cycle has not been performed a predetermined number of times (twice), one cycle from the boat loading (S104) to the separation process (S116) is repeated. On the other hand, when it is determined that the one cycle has been performed a predetermined number of times, the process proceeds to the next step (S120).

The boat 217 is then loaded into the process chamber 201 according to the same processing procedure as in the boat loading (S104) described above (boat loading: S120), and the pressure and temperature inside the process chamber 201 are regulated according to the same processing procedure and process conditions as in the pressure regulation and temperature regulation (S106) described above (pressure and temperature regulation: S122).

(Film Forming Process: S124)

A film-forming gas (raw material gas, dopant gas) is then supplied to the wafer 200 according to the same processing procedure as in the film forming process (S108) described above.

The process conditions when supplying the film-forming gas in this step are as follows. Raw material gas and dopant gas supply time: 400 to 800 minutes. Other process conditions can be the same as the process conditions when supplying the film-forming gas in the film forming process (S108).

As described above, the Si film having a thickness of 10 µm is already formed on the wafer 200. Therefore, to form a Si film having a desired thickness of 14 µm, the film-forming gas is supplied to the wafer 200 under the above-described conditions to form a remaining Si film having a thickness of 4 µm and adjust the film thickness in this step.

The boat 217 is then moved from the process chamber 201 into the waiting room 141 according to the same processing procedure as in the boat unloading (S112) described above (boat unloading: S126), and the processed wafer 200 is cooled to a predetermined temperature in the waiting room 141 according to the same processing procedure and process conditions as in the wafer cooling (S114) described above (wafer cooling: S128).

(Wafer Discharge: S130)

The processed wafer 200 is then unloaded (wafer discharge) from the substrate mounting table 222 provided in the boat 217 in the waiting room 141 into the cassette 100 on the transfer shelf 123 by the substrate transferrer 112. Specifically, for example, five wafers 200 are simultaneously transferred from the substrate mounting table 222 of the boat 217 into the cassette 100 on the transfer shelf 123 by the five tweezers 111. This process continues until the scheduled wafers 200 (for example, 100 to 200 wafers 200) are unloaded from the boat 217. Then, the substrate processing process ends.

(5) Effects of the Present Embodiment

According to the present embodiment, one or more of the following effects can be obtained.

(a) By interrupting the film forming process and performing the separation process of the wafer 200 mounted on the substrate mounting table 222 at least once until a film having a desired thickness is formed on the wafer 200 after the film forming process is started, it is possible to prevent the wafer 200 and the boat 217 from being fixed to each other. Therefore, it is possible to avoid a situation in which the wafer 200 cannot be separated from the boat 217 after forming a film having a desired thickness on the wafer 200.

(b) By performing a cycle, in which a process of supplying the film-forming gas, a process of interrupting the supply of the film-forming gas before a film having a critical thickness is formed on the wafer 200, and a separation process are performed in this order, a predetermined number of times until a film having a desired thickness is formed on the wafer 200 after the film forming process is started, it is possible to reliably prevent the wafer 200 and the boat 217 from being fixed to each other.

In the memory 124*c* of the controller 124, a process recipe describing the procedures, conditions, and the like of the above-described substrate processing (for example, S102 to S130) is stored in a readable manner. Therefore, by reading the process recipe and executing the process recipe once, it is possible to form a film having a desired thickness on the wafer 200 while reliably preventing the wafer 200 and the boat 217 from being fixed to each other. As a result, it is possible to facilitate the operation of the film forming process.

(c) Under the conditions described above, only the separation process, that is, the process of lifting the wafer 200 mounted on the substrate mounting table 222 and then lowering the wafer 200 to its original position on the substrate mounting table 222 by the substrate transferrer 112 is performed, and the unloading and loading of the wafer 200 are not performed, so that it is possible to shorten the time required for the substrate processing process and improve the productivity. Here, "unloading" refers to transferring the processed wafer 200 from the substrate mounting table 222 provided in the boat 217 in the waiting room 141 to the cassette 100 on the transfer shelf 123 by the substrate transferrer 112. "Loading" refers to transferring the unprocessed wafer 200 from the cassette 100 on the transfer shelf 123 to the boat 217 in the waiting room 141 by the substrate transferrer 112.

(d) The substrate transferrer 112 includes a plurality of tweezers 111. Therefore, by performing the separation process of a plurality of wafers 200 at the same time, it is possible to shorten the time required for the substrate processing process and improve the productivity.

(e) When the failure of the separation process is detected by the sensor 119 provided in the substrate transferrer 112 while the separation process is being performed, the subsequent process is interrupted. Therefore, it is possible to improve the quality of the substrate and improve production efficiency. By issuing an alarm, the operator can be notified of the abnormal situation. Since it is possible to reliably prevent the wafer 200 and the boat 217 from being fixed to each other by performing the retry process, it is possible to suppress the loss of the wafer 200.

Other Embodiments of the Present Disclosure

The embodiment of the present disclosure has been specifically described above. However, the present disclosure is not limited to the embodiment described above, and various modifications can be made without departing from the gist of the present disclosure.

Figure 8:
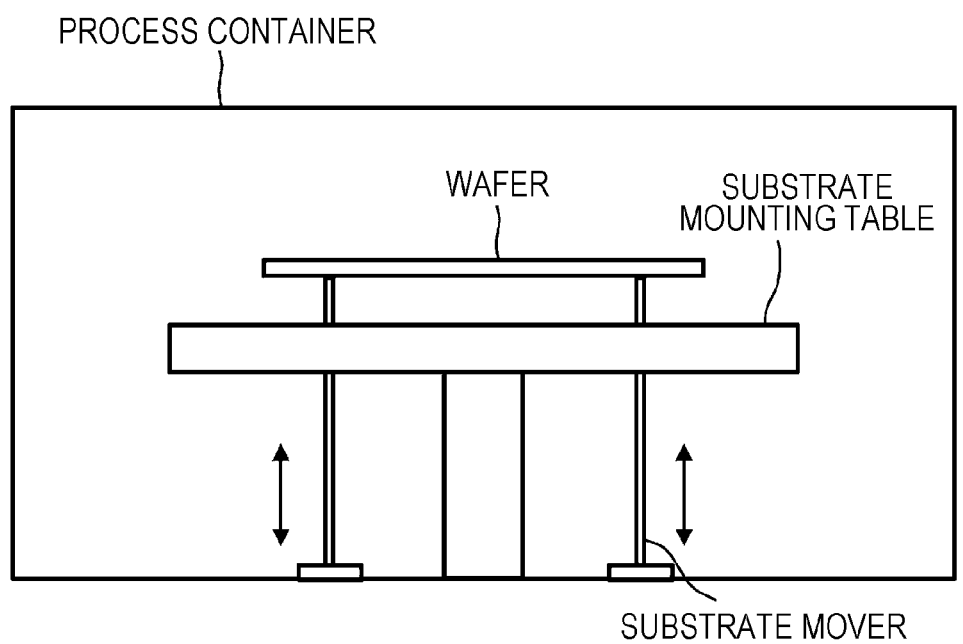
FIG. 8 is a vertical cross-sectional view of a main part of a process container in a substrate processing apparatus preferably used in another embodiment of the present disclosure.

In the above embodiment, an example of forming a film using the batch-type substrate processing apparatus 1 that processes a plurality of substrates at a time has been described. The present disclosure is not limited to the embodiment described above, and can be appropriately applied to a case of forming a film using a single wafer type substrate processing apparatus that processes one or more substrates at a time, for example. When a film is formed using a single wafer type substrate processing apparatus, the separation process is preferably performed in the process container. Specifically, the film forming process is performed with a wafer mounted on the substrate mounting table (susceptor) provided in the process container. As shown in FIG. 8, a substrate mover such as a lift pin for lifting a wafer mounted on the substrate mounting table and then lowering the wafer to its original position on the substrate mounting table is provided in the process container. After the film forming process is performed, a separation process is performed to lift the wafer mounted on the substrate mounting table and then lower the wafer to its original position on the substrate mounting table by using the substrate mover. By repeating the film forming process and the separation process a predetermined number of times, a film having a desired thickness can be formed on the wafer. By performing the separation process in the process container in this manner, it is possible to shorten the time required for the substrate processing process and improve the productivity.

In the above embodiment, an example of forming a film using a substrate processing apparatus having a hot wall type process furnace has been described. The present disclosure is not limited to the embodiment described above, and can be appropriately applied to a case of forming a film using a substrate processing apparatus having a cold wall type process furnace.

Even when these substrate processing apparatuses are used, each process can be performed according to the same processing procedure and process conditions as in the embodiment described above. Therefore, the same effects as in the embodiment described above can be obtained.

In the above embodiment, the separation process is defined as a process of lifting the wafer 200 mounted on the substrate mounting table 222 and then lowering the wafer 200 to its original position on the substrate mounting table 222 by the substrate transferrer 112. However, the present disclosure is not limited to this. For example, the separation process may be a process of shifting the wafer 200 mounted on the substrate mounting table 222 to move the wafer 200 on the substrate mounting table 222 and then shifting the wafer 200 again to return the wafer 200 to its original position on the substrate mounting table 222 by the substrate transferrer 112. In the separation process (S116) described above, at least one of these separation processes can be used. Additionally, in these cases, the same effects as in the embodiment described above can be obtained.

Similarly, the separation process may be a process of unloading the wafer 200 mounted on the substrate mounting table 222 and then loading the wafer 200 to its original position on the substrate mounting table 222 by the substrate transferrer 112. In this case, the effects of the embodiment described above can be reliably obtained.

In the above embodiment, an example of forming a conductive polycrystalline silicon film doped with a dopant on the wafer 200 has been described. However, the present disclosure is not limited to this. For example, the present disclosure can also be applied to a case where a conductive amorphous silicon film (a-Si film, amorphous Si film) doped with a dopant is formed on the wafer 200 and a case where a conductive single crystal silicon film (single crystal Si film) doped with a dopant is formed on the wafer 200. The present disclosure can also be applied to a case of forming a non-doped polycrystalline silicon film, a non-doped amorphous silicon film, and a non-doped single crystal silicon film on the wafer 200 without using a dopant gas. The present disclosure can also be applied to a case where multicomponent Si films, such as a silicon nitride film (SiN film), a silicon oxide film (SiO film), a silicon carbide film (SiC film), a silicon carbon nitride film (SiCN film), a silicon oxynitride film (SiON film), a silicon oxycarbide film (SiOC film), a silicon oxycarbonitride film (SiOCN film), a silicon borocarbonitride film (SiBCN film), and a silicon boronitride film (SiBN film), are formed on the wafer 200 by further using reactant gases, such as a nitrogen (N)-containing gas, an oxygen (O)-containing gas, a carbon (C)-containing gas, an N and C-containing gas, and a boron (B)-containing gas, as film-forming gases in addition to the raw material gas and the like. The processing procedures and the process conditions when supplying various film-forming gases can be the same as those described above, for example. Additionally, in these cases, the same effects as in the embodiment described above can be obtained.

In the above embodiment, an example of adjusting the film thickness in the final (third) film forming process when forming a film having a desired thickness on the wafer 200 has been described. However, the present disclosure is not limited to this. For example, the film thickness may be adjusted in either the first film forming process or the second film forming process.

In the above embodiment, an example of performing a chemical vapor deposition (CVD) process, in which a plurality of types of film-forming gases are simultaneously and continuously supplied into the process chamber 201, in the film forming process (S108, S124) has been described. However, the present disclosure is not limited to this. For example, a cyclic CVD process for intermittently supplying a film-forming gas may be performed. For example, an alternate supply process may be performed in which a step of alternately supplying the raw material gas and the reactant gas described above is repeated. That is, assuming that supply of raw material gas→purge→supply of reactant gas→purge is one cycle, this cycle may be repeated a predetermined number of times. In these cases, for example, a cycle of growing a Si-containing layer to a thickness of 250 nm may be repeated 20 times to form a Si-containing film with a thickness of 5 μm.

In the case of a cyclic CVD process or an alternate supply process, assuming that vacuum exhaust is one cycle, this cycle may be repeated in the purge step. In this case, it is possible to obtain effects such as an improvement in wafer in-plane uniformity.

It is preferable that the recipe describing the above procedures, conditions, and the like and used in each process is individually prepared according to the contents of the process and stored in the memory 124c through the electric communication line or the external memory 126. Then, when starting each process, it is preferable that the CPU 124a appropriately selects an appropriate recipe from a plurality of recipes stored in the memory 124c according to the content of the process. As a result, it is possible to form films having various film types, composition ratios, film qualities, and film thicknesses with good reproducibility by using one substrate processing apparatus. Since the burden on the operator can be reduced, it is possible to start each process quickly while avoiding an operation error.

The above-described recipe is not limited to a newly created one, and may be prepared by changing the existing recipe already installed in the substrate processing apparatus, for example. When changing the recipe, the changed recipe may be installed in the substrate processing apparatus through an electric communication line or a recording medium in which the recipe is recorded. Alternatively, an existing recipe already installed in the substrate processing apparatus may be directly changed by operating the input/output device 125 provided in the existing substrate processing apparatus.

The embodiments described above can be used in combination as appropriate. The processing procedures and the process conditions at this time can be the same as the processing procedures and the process conditions in the embodiment described above, for example.

According to the present disclosure, it is possible to provide a technique for avoiding a situation in which, when unloading a substrate from a substrate holder, the substrate and the substrate holder are fixed to each other by a formed film and accordingly, the substrate cannot be separated from the substrate holder.

What is claimed is:

1. A substrate processing apparatus, comprising:
a substrate holder provided with a substrate mounting table on which a substrate is mounted;
a substrate transferrer configured to load or unload the substrate onto or from the substrate mounting table;
a process container configured to accommodate the substrate holder holding the substrate;
a film-forming gas supply system configured to supply a film-forming gas to the substrate in the process container; and
a controller configured to be capable of controlling the substrate transferrer and the film-forming gas supply system to interrupt a film forming process at least once during a period from a start of the film forming process in which the film-forming gas is supplied to form a film of a desired thickness on the substrate, before a film of a critical thickness at which the substrate cannot be separated off from the substrate mounting table by the substrate transfer is formed, cool the substrate to a predetermined temperature, and perform a process for separating, in which the substrate transfer lifts up the substrate placed on the substrate mounting table and then lowers only the substrate to an original position on the substrate mounting table without transporting the substrate.

2. The substrate processing apparatus according to claim 1,
wherein the controller is configured to be capable of controlling the substrate transferrer and the film-forming gas supply system to perform a cycle, in which the process of supplying the film-forming gas, the process of interrupting the supply of the film-forming gas before the film having the critical thickness is formed on the substrate, and the process for separating are performed in this order, a predetermined number of times until the film having the desired thickness is formed on the substrate after the film forming process is started.

3. The substrate processing apparatus according to claim 1,
wherein the process for separating is a process performed simultaneously on a plurality of substrates.

4. The substrate processing apparatus according to claim 1, wherein
the substrate transferrer includes a sensor configured to detect a success or a failure of the process for separating, and
the controller is configured to interrupt subsequent processes when the sensor detects the failure of the process for separating.

5. The substrate processing apparatus according to claim 4,
wherein the controller is configured to issue an alarm when the sensor detects the failure of the process for separating.

6. The substrate processing apparatus according to claim 4, wherein the failure of the process for separating indicates that at least one of the substrate holder, the substrate transferrer, and the substrate is damaged.

7. The substrate processing apparatus according to claim 4, wherein the failure of the process for separating indicates that the substrate cannot be separated from the substrate holder with a predetermined torque of the substrate transferrer.

8. The substrate processing apparatus according to claim 4, wherein the controller is configured to be capable of performing a retry process by the substrate transferrer when the sensor detects the failure of the process for separating.

9. The substrate processing apparatus according to claim 8, wherein the retry process is performed a predetermined number of times, which is one or more times.

10. The substrate processing apparatus according to claim 9, wherein the controller interrupts subsequent processes when the sensor detects the failure of the process for separating in the retry process.

11. The substrate processing apparatus according to claim 9, wherein the controller continues subsequent processes when the sensor detects a success of the process for separating in the retry process.

12. A method of manufacturing a semiconductor device, comprising:
loading a substrate onto a substrate mounting table provided in a substrate holder by a substrate transferrer;
transferring the substrate holder holding the substrate into a process container; and
supplying a film-forming gas to the substrate in the process container,
wherein, in the supply of the film-forming gas to the substrate, between a start of supplying the film-forming gas to the substrate and a formation of a film of a desired thickness on the substrate, the supply of the film-forming gas is interrupted at least once before a critical thickness of the film is formed at which the substrate cannot be separated off from the substrate mounting part by a substrate transfer mechanism, and the substrate is cooled to a predetermined temperature, the substrate placed on the substrate mounting part is lifted by the substrate transfer mechanism, and a separation process is performed in which the substrate is lowered to an original position on the substrate mounting part without transporting the substrate.

13. A non-transitory computer-readable recording medium storing a program that causes, by a computer, a substrate processing apparatus to perform a process comprising:
loading a substrate onto a substrate mounting table provided in a substrate holder by a substrate transferrer;
transferring the substrate holder holding the substrate into a process container; and
supplying a film-forming gas to the substrate in the process container,
wherein, in the supply of the film-forming gas to the substrate, between a start of supplying the film-forming gas to the substrate and a formation of a film of a desired thickness on the substrate, the supply of the film-forming gas is interrupted at least once before a critical thickness of the film is formed at which the substrate cannot be separated off from the substrate mounting part by a substrate transfer mechanism, and the substrate is cooled to a predetermined temperature, the substrate placed on the substrate mounting part is lifted by the substrate transfer mechanism, and then a separation process is performed in which the substrate is lowered to an original position on the substrate mounting part without transporting the substrate.

14. The substrate processing apparatus according to claim 1, further comprising:
a waiting chamber configured to below the process container for loading and unloading the substrate, and
wherein the process for separating is configured to be performed in the waiting chamber.

* * * * *